(12) United States Patent
Kumakura

(10) Patent No.: US 7,906,733 B2
(45) Date of Patent: Mar. 15, 2011

(54) ELECTRONIC CIRCUIT DEVICE

(75) Inventor: Susumu Kumakura, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 12/530,708

(22) PCT Filed: May 21, 2008

(86) PCT No.: PCT/JP2008/059754
§ 371 (c)(1),
(2), (4) Date: Sep. 10, 2009

(87) PCT Pub. No.: WO2008/143359
PCT Pub. Date: Nov. 27, 2008

(65) Prior Publication Data
US 2010/0084177 A1    Apr. 8, 2010

(30) Foreign Application Priority Data
May 22, 2007 (JP) .................... 2007-134927

(51) Int. Cl.
*H01R 12/04* (2006.01)
(52) U.S. Cl. ......... 174/261; 174/260; 174/266; 174/267; 257/690; 257/686; 257/730; 257/784; 257/779; 361/721; 361/760; 361/767; 361/784; 361/790; 438/14; 438/106; 438/622
(58) Field of Classification Search .................. 174/261, 174/260, 266, 267; 257/690, 686, 730, 784, 257/779, 777, 797; 361/676–790, 792; 438/14, 438/106, 622
See application file for complete search history.

(56) References Cited

U.S. PATENT DOCUMENTS

| 4,833,402 | A | * | 5/1989 | Boegh-Petersen | 324/754 |
| 5,086,337 | A | * | 2/1992 | Noro et al. | 257/726 |
| 5,400,220 | A | * | 3/1995 | Swamy | 361/760 |
| 5,477,933 | A | * | 12/1995 | Nguyen | 174/262 |
| 5,592,562 | A | * | 1/1997 | Rooks | 382/150 |
| 5,723,347 | A | * | 3/1998 | Hirano et al. | 29/25.01 |
| 5,811,982 | A | * | 9/1998 | Beaman et al. | 324/762 |
| 5,812,378 | A | * | 9/1998 | Fjelstad et al. | 361/769 |
| 5,915,169 | A | * | 6/1999 | Heo | 438/118 |
| 5,953,816 | A | * | 9/1999 | Pai et al. | 29/879 |
| 5,973,930 | A | * | 10/1999 | Ikeda et al. | 361/768 |

(Continued)

FOREIGN PATENT DOCUMENTS

JP          9-051017 A        2/1997

(Continued)

*Primary Examiner* — Xiaoliang Chen
(74) *Attorney, Agent, or Firm* — Fitzpatrick, Cella, Harper & Scinto

(57) ABSTRACT

Provided is an electronic circuit device in which the bonding state of electrodes can be detected easily with high precision. The electronic circuit device has a stack structure in which a plurality of electronic circuit boards (1a, 1b, 100a, 100b, 100c) are stacked in three or more layers through ball electrodes (10a, 10b, 20a, 20b) bonded to electrode pads (30a, 30b, 40b, 50a, 60a), wherein the electrode pads are disposed such that transmission shaded images of a pair of the electrode pads provided between adjacent layers partially overlap each other and have a non-overlapping region in which the transmission shaded images of the pair of electrode pads are free from overlapping and such that the transmission shaded image of the non-overlapping region is at least partially free from overlapping with transmission shaded images of all the other electrode pads.

3 Claims, 6 Drawing Sheets

U.S. PATENT DOCUMENTS

| | | | |
|---|---|---|---|
| 5,990,546 A * | 11/1999 | Igarashi et al. | 257/700 |
| 6,050,832 A * | 4/2000 | Lee et al. | 439/91 |
| 6,086,386 A * | 7/2000 | Fjelstad et al. | 439/70 |
| 6,333,563 B1 * | 12/2001 | Jackson et al. | 257/778 |
| 6,344,752 B1 * | 2/2002 | Hagihara et al. | 324/754 |
| 6,414,248 B1 * | 7/2002 | Sundstrom | 174/260 |
| 6,507,118 B1 * | 1/2003 | Schueller | 257/778 |
| 6,509,530 B2 * | 1/2003 | Pearson et al. | 174/260 |
| 6,657,134 B2 * | 12/2003 | Spielberger et al. | 174/260 |
| 6,680,212 B2 * | 1/2004 | Degani et al. | 438/14 |
| 6,703,851 B1 * | 3/2004 | Howell | 324/754 |
| 6,870,267 B2 * | 3/2005 | Zohni | 257/773 |
| 6,889,429 B2 * | 5/2005 | Celaya et al. | 29/840 |
| 7,161,363 B2 * | 1/2007 | Gleason et al. | 324/754 |
| 7,332,922 B2 * | 2/2008 | Beaman et al. | 324/762 |
| 7,397,129 B2 * | 7/2008 | Lee | 257/774 |
| 7,436,061 B2 * | 10/2008 | Nakayama | 257/730 |
| 7,462,939 B2 * | 12/2008 | Sundstrom | 257/778 |
| 7,554,206 B2 * | 6/2009 | Haba et al. | 257/780 |
| 7,566,960 B1 * | 7/2009 | Conn | 257/686 |
| 7,687,391 B2 * | 3/2010 | Harvey et al. | 438/622 |
| 7,719,121 B2 * | 5/2010 | Humpston et al. | 257/784 |
| 2005/0023033 A1 * | 2/2005 | Saiki et al. | 174/260 |
| 2006/0138647 A1 * | 6/2006 | Crisp et al. | 257/723 |
| 2007/0090506 A1 * | 4/2007 | Sundstrom | 257/686 |
| 2007/0210437 A1 * | 9/2007 | Noma et al. | 257/690 |
| 2008/0093749 A1 * | 4/2008 | Gerber et al. | 257/784 |
| 2008/0253095 A1 * | 10/2008 | Baraton et al. | 361/752 |

FOREIGN PATENT DOCUMENTS

| | | |
|---|---|---|
| JP | 09-214088 A | 8/1997 |
| JP | 9-219583 A | 8/1997 |
| JP | 11-233936 A | 8/1999 |
| JP | 2002-289745 A | 10/2002 |
| JP | 2002-314040 A | 10/2002 |
| JP | 2003-218505 A | 7/2003 |

* cited by examiner

ELECTRONIC CIRCUIT DEVICE

TECHNICAL FIELD

The present invention relates to an electronic circuit device having a semiconductor package and a printed wiring board which are connected to each other through intermediation of ball electrodes, and a stack structure in which a plurality of printed wiring boards are stacked together through intermediation of ball electrodes, which is capable of detecting the connection state of ball electrodes with ease and high precision.

BACKGROUND ART

In recent years, there can be seen advancement in the density increase of an electronic circuit device, and an attention is paid onto an electronic circuit device, in which a plurality of ball electrodes are arranged in a peripheral configuration or an array configuration to connect a semiconductor package and a printed wiring board.

However, it is difficult to visually confirm the connection state of ball electrodes that are disposed between the semiconductor package and the printed wiring board from outside.

For that reason, as a method of confirming the connection state of ball electrodes, there is known a method of applying a feature including a recess or intrusion to the shape of a pad to which a ball electrode is to be connected and determining the connection state based on the shape of a shaded image (transmission shaded image) of the ball electrode obtained by x-ray transmission (or x-ray fluoroscopy) (see Japanese Patent Application Laid-Open No. H09-219583 and Japanese Patent No. 3601714).

Further, there is also known a technology of making different from each other the shapes in which an electrode pad provided on a lower surface of an electronic circuit board and a foot pattern provided on an upper surface of a board are connected through intermediation of a ball electrode to easily confirm the connection state between the upper and lower members by one-time x-ray inspection (Japanese Patent Application Laid-Open No. H09-051017).

However, in recent years, in order to further advance density increase, attention is paid to an electronic circuit device in which a semiconductor package and a printed wiring board which are connected by ball electrodes are not disposed in a planar configuration as in the conventional art, but are stacked in three or more layers.

In such an electronic circuit board, because the shaded images obtained by transmission of ball electrodes that are disposed in a stacked fashion are displayed in a superimposed manner, there is still an unsolved problem that the connection state of the ball electrodes cannot easily be confirmed by the above-mentioned procedure.

Also, in the electronic circuit device having the stack structure, it is difficult to radiate a heat generated in the electronic circuit device to outside as compared to the conventional electronic circuit device having the planar arrangement. Therefore, the electronic circuit device needs to have such a stack structure as to efficiently radiate heat to outside. In general, the ball electrode is smaller in thermal conductivity than other members and therefore serves as a good radiation path.

However, in order to image the connection state of the ball electrodes by x-ray inspection, when the electrode pads and the ball electrodes which are provided in different layers are disposed in a nested manner, a heat generated in the semiconductor package or the printed wiring board needs to excessively pass through the board, with the result that the heat generated in the interior of the stack structure is difficult to be radiated to outside.

DISCLOSURE OF THE INVENTION

The present invention has been accomplished in view of the above problems, and it is, therefore, an object of the present invention to provide an electronic circuit device having a structure in which a heat generated in a stack structure is efficiently radiated and is capable of detecting, by a simple method, a connection failure of ball electrodes in the stack structure in which a plurality of semiconductor packages and a plurality of printed wiring boards are stacked together.

The present invention provides an electronic circuit device having a stack structure in which a plurality of electronic circuit boards are stacked in three or more layers through ball electrodes bonded to electrode pads, wherein the electrode pads are disposed such that transmission shaded images of a pair of the electrode pads provided between adjacent layers partially overlap each other and have a non-overlapping region in which the transmission shaded images of the pair of electrode pads are free from overlapping and such that the transmission shaded image of the non-overlapping region is at least partially free from overlapping with transmission shaded images of all the other electrode pads.

In the present invention, it is preferred that the electrode pads provided in the different layers each has a protrusion and are disposed such that the protrusions are partly free from overlapping.

Furthermore, it is also preferred that each of the electrode pads partially overlaps all the other electrode pads provided at corresponding locations in the layer (or board) stacking direction of the respective layers, which is advantageous for attaining the efficient heat radiation.

By adopting such a configuration, the radiation path can be shortened, so that efficient radiation can be achieved, and the connection state of the ball electrodes in the stack structure can be visually confirmed easily by means of the shapes of the transmission shaded images.

Further features of the present invention will become apparent from the following description of exemplary embodiments with reference to the attached drawings.

BEST MODE FOR CARRYING OUT THE INVENTION

Preferred embodiments of the present invention will now be described in detail with reference to the accompanying drawings.

Figure 1:
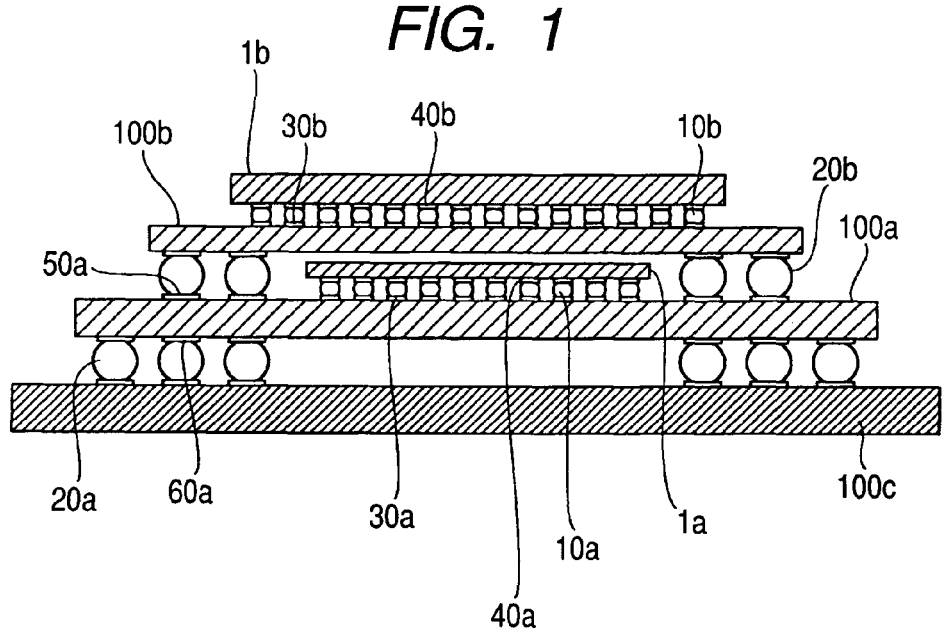
FIG. 1 is a cross-sectional view illustrating an electronic circuit device according to an embodiment of the present invention.

As illustrated in FIG. 1, a first semiconductor package 1*a* and a first printed wiring board 100*a* are connected to each other by a plurality of ball electrodes 10*a*, and a second semiconductor package 1*b* and a second printed wiring board 100*b* are connected to each other by a plurality of ball electrodes 10*b*. A third printed wiring plate 100*c* and the first printed wiring board 100*a* are stacked together through intermediation of ball electrodes 20*a*. Further, the first printed wiring board 100*a* and the second printed wiring board 100*b* are stacked together through intermediation of ball electrodes 20*b*. That is, electronic circuit boards such as semiconductor packages or printed wiring boards are stacked together in a multi-layer structure, and the respective layers are connected to each other through intermediation of ball electrodes.

In the electronic circuit device having the above stack structure, the ball electrodes 10*a* are connected to the printed wiring board 100*a* through intermediation of electrode pads 30*a* that are disposed on the printed wiring board 100*a*, and each of the electrode pads 30*a* has a protrusion in a surface direction of the printed wiring board 100*a*. Incidentally, the term "surface direction of a printed wiring board" herein employed refers to a direction parallel to the surface of the printed wiring board. That is, it is intended to mean that the cross-sectional shape of the electrode pad 30*a* taken along a plane parallel to the surface of the printed wiring board 100*a* is not circular, but has a protruding portion in at least a part of a circle. The ball electrodes 10*b* are connected to the printed wiring board 100*b* through intermediation of electrode pads 30*b* that are disposed on the printed wiring board 100*b*, and each of the electrode pads 30*b* has a protrusion in the surface direction of the printed wiring board 100*b*. Then, the electrode pads 30*a* and the electrode pads 30*b* are disposed such that transmission shaded images obtained by transmission of the electrode pads 30*a* and the electrode pads 30*b* do not overlap each other at least partially in the protruding portions of the respective electrode pads 30*a* and 30*b*.

Further, the ball electrodes 20*b* are connected to the printed wiring board 100*a* through intermediation of electrode pads 50*a* that are disposed on the printed wiring board 100*a*, and each of the electrode pads 50*a* has a portion protruding in the surface direction of the printed wiring board 100*a*. Then, the electrode pads 30*b* and the electrode pads 50*a* are disposed such that transmission shaded images obtained by transmission of the electrode pads 30*b* and the electrode pads 50*a* do not overlap each other at least partially in the protruding portions of the respective electrode pads 30*b* and 50*a*.

Further, the ball electrodes 10*b* are connected to the semiconductor package 1*b* through intermediation of electrode pads 40*b* that are disposed on the semiconductor package 1*b*, and each of the electrode pads 40*b* has a portion protruding in the surface direction of the semiconductor package 1*b*. Then, the electrode pads 30*b* and the electrode pads 40*b* are disposed such that transmission shaded images obtained by transmission of the electrode pads 30*b* and the electrode pads 40*b* do not overlap each other at least partially in the protruding portions of the respective electrode pads 30*b* and 40*b*.

The ball electrodes 20*a* on a rear surface of the printed wiring board 100*a* which is on a side opposite to a front surface side on which the ball electrodes 20*b* are disposed are connected to the printed wiring board 100*a* through intermediation of electrode pads 60*a* that are disposed on the printed wiring board 100*a*. Each of the electrode pads 60*a* has a portion protruding in the surface direction of the printed wiring board 100*a*. Then, the electrode pads 50*a* and the electrode pads 60*a* are disposed such that transmission shaded images obtained by transmission of the electrode pads 50*a* and the electrode pads 60*a* do not overlap each other at least partially in the protruding portions of the respective electrode pads 50*a* and 60*a*.

The electrode pads 30*a*, 30*b*, 40*a*, and 40*b* have the same diameter and the same axis. Also, the electrode pads 50*a* and 60*a* have the same diameter and are coaxial.

As described above, the semiconductor package 1*a* is mounted on the printed wiring board 100*a* through intermediation of the ball electrodes 10*a*, and the semiconductor package 1*b* is mounted on the printed wiring board 100*b* through intermediation of the ball electrodes 10*b*. Also, the printed wiring boards 100*a* and 100*b* are connected to each other by the ball electrodes 20*b*, and the printed wiring boards 100*a* and 100*c* are connected to each other by the ball electrodes 20*a*.

Further, the ball electrodes 10*b* and the ball electrodes 10*a* that are positioned immediately below the ball electrodes 10*b* have the same outer diameter (the same diameter) and the same central axis (being coaxial). The ball electrodes 20*b* and the ball electrodes 20*a* that are positioned immediately below the ball electrodes 20*b* have the same outer diameter (the same diameter) and the same central axis (being coaxial). With the above arrangement of the ball electrodes, heat is liable to be transferred through the ball electrodes that are smaller in thermal resistance among the members which constitute the electronic circuit device, which is advantageous in heat radiation. However, there is no limit of the arrangement of the ball electrodes so far as it does not deviate from the spirit of the present invention. That is, it is only necessary that the ball electrodes which are disposed in the different layers overlap each other in a part and do not overlap each other in another part.

Figure 2:
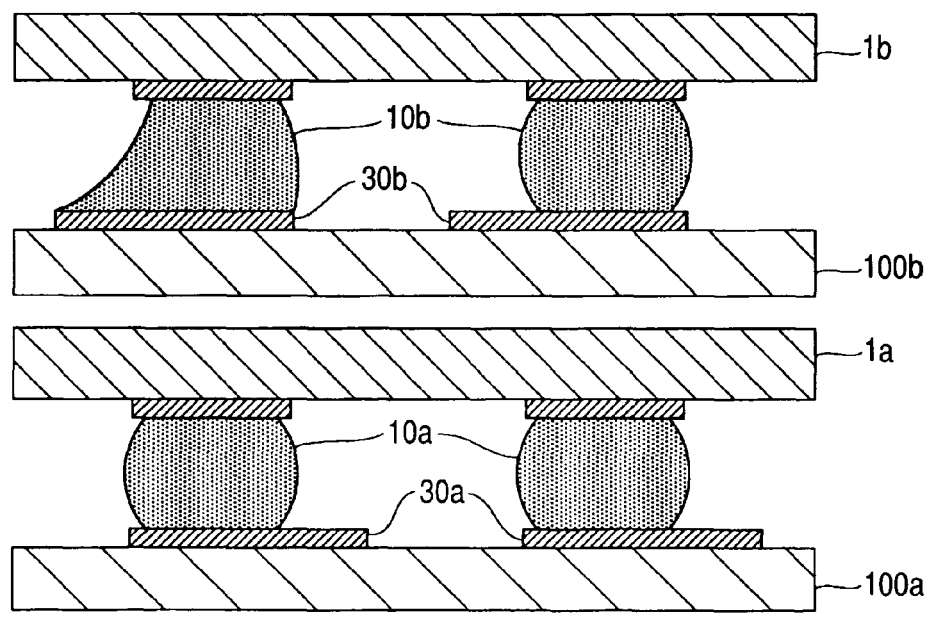
FIG. 2 is an enlarged cross-sectional view illustrating a portion of the electronic circuit device of FIG. 1.

FIG. 2 is an enlarged cross-sectional view illustrating an area including the ball electrodes 10*b* and the ball electrodes 10*a* that are positioned immediately below the ball electrodes 10*b* which is a part of the electronic circuit device illustrated in FIG. 1.

Figure 3A:
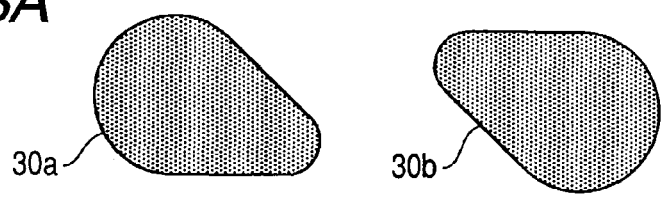
FIGS. 3A and 3B are views illustrating electrode pads of FIG. 2 and shaded images thereof.
Figure 3B:

FIG. 3A illustrates a planar shape in the printed wiring board 100*a* surface direction of the electrode pads 30*a* to which the ball electrodes 10*a* are connected in FIG. 2, and a planar shape in the printed wiring board 100*b* surface direction of the electrode pads 30*b* to which the ball electrodes 10*b* are connected in FIG. 2. Further, FIG. 3B illustrates shaded image through transmission (transmission shaded image) obtained by transmission of the ball electrodes 10*b* and the ball electrodes 10*a* shown in FIG. 2.

The ball electrode 10*b* at the left side of FIG. 2 is bonded to the electrode pad 30*b* in a state where the ball electrode 10*b* fully extends over the protruding portion of the electrode pad 30*b*. On the other hand, the ball electrode 10*a* is bonded to the electrode pad 30*a* in a state where the ball electrode 10*a* does not extend over the protruding portion of the electrode pad 30*a*. A shaded image E1 is obtained by transmission of the ball electrodes 10*a* and 10*b* in this state. The ball electrode 10*b* at the right side of FIG. 2 is bonded to the electrode pad 30*b* in a state where the ball electrode 10*b* does not extend over the protruding portion of the electrode pad 30*b*. On the other hand, the ball electrode 10*a* is bonded to the electrode pad 30*a* in a state where the ball electrode 10*a* does not extend over the protruding portion of the electrode pad 30a. A shaded image E2 is obtained by transmission of the ball electrodes 10a and 10b in this state.

As illustrated in FIG. 3A, the electrode pad 30a to which the ball electrode 10a is connected and the electrode pad 30b to which the ball electrode 10b is connected are each allowed to have a tear drop shaped cross section taken along a plane parallel to the printed wiring board in which a protruding portion is added to a circle. For that reason, by determining a difference in shape of the shaded images E1 and E2 by use of an x-ray inspection apparatus, the bonding state of the ball electrode 10a to the electrode pad 30a and the bonding state of the ball electrode 10b to the electrode pad 30b can easily be detected.

For example, the determination of the quality of the bonding state can be determined such that when the circularity of the shaded image (E1, E2) is equal to or more than 30% of the outer diameter of the ball electrode (10a, 10b) prior to the bonding to the electrode pad (30a, 30b), the bonding state is determined to be good, while when the circularity of the shaded image (E1, E2) is less than 30% of the outer diameter of the ball electrode (10a, 10b) prior to the bonding to the electrode pad (30a, 30b), the bonding state is determined to be defective. However, the criteria for the determination of the quality can be set depending on the material of the ball electrode to be used or the intended use of the electronic circuit device.

Figure 4:
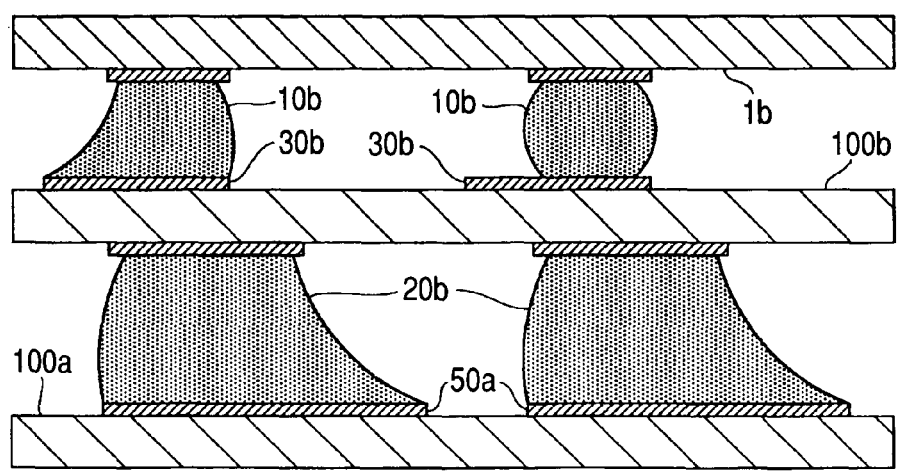
FIG. 4 is an enlarged cross-sectional view illustrating a portion of the electronic circuit device of FIG. 1.

FIG. 4 is an enlarged cross-sectional view illustrating an area including the ball electrodes 10b and the ball electrodes 20b that are positioned immediately below the ball electrodes 10b.

Figure 5A:
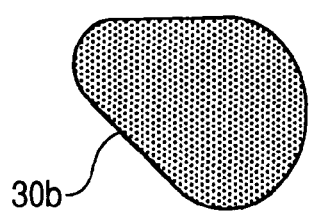
FIGS. 5A and 5B are views illustrating electrode pads of FIG. 4 and the shaded images thereof.
Figure 5A:
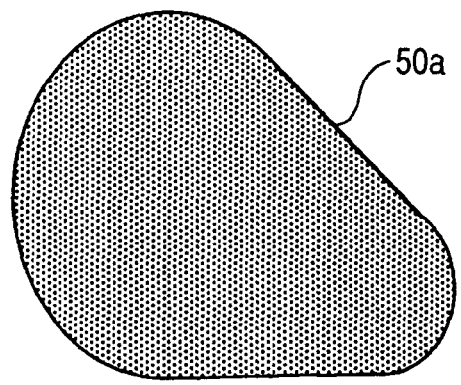
Figure 5B:
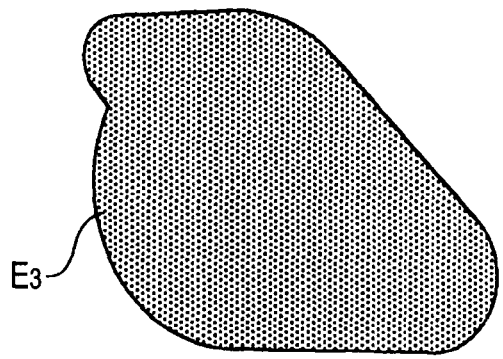
Figure 5B:
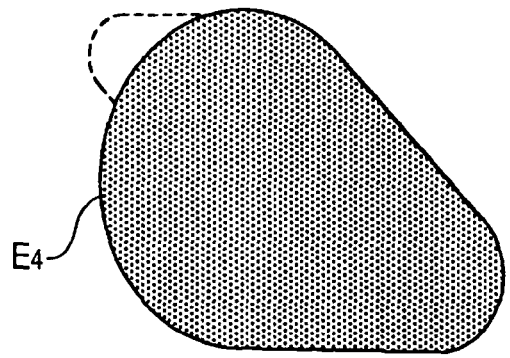

FIG. 5A illustrates a planar shape in the printed wiring board 100a surface direction of the electrode pads 50a to which the ball electrodes 20b are connected in FIG. 4, and a planar shape in the printed wiring board 100b surface direction of the electrode pads 30b to which the ball electrodes 10b are connected in FIG. 4. Further, FIG. 5B illustrates shaded image through transmission (transmission shaded image) obtained by transmission of the ball electrodes 10b and the ball electrodes 20b shown in FIG. 4.

The ball electrode 10b at the left side of FIG. 4 is bonded to the electrode pad 30b in a state where the ball electrode 10b fully extends over the protruding portion of the electrode pad 30b. Further, the ball electrode 20b is bonded to the electrode pad 50a in a state where the ball electrode 20b fully extends over the electrode pad 50a including the protruding portion thereof. A shaded image E3 is obtained by transmission of the ball electrodes 10b and 20b in this state. The ball electrode 10b at the right side of FIG. 4 is bonded to the electrode pad 30b in a state where the ball electrode 10b does not extend over the protruding portion of the electrode pad 30b. Further, the ball electrode 20b is bonded to the electrode pad 50a in a state where the ball electrode 20b fully extends over the electrode pad 50a. A shaded image E4 is obtained by transmission of the ball electrodes 10b and 20b in this state.

As illustrated in FIG. 5A, the electrode pad 30b to which the ball electrode 10b is connected and the electrode pad 50a to which the ball electrode 20b is connected are each allowed to have a tear drop shaped cross section in which a protruding portion is added to a circle. For that reason, by determining a difference in shape of the shaded images E3 and E4 by use of an x-ray inspection apparatus, the bonding state of the ball electrode 10b to the electrode pad 30a and the bonding state of the ball electrode 20b to the electrode pad 50a can easily be detected.

Figure 6:
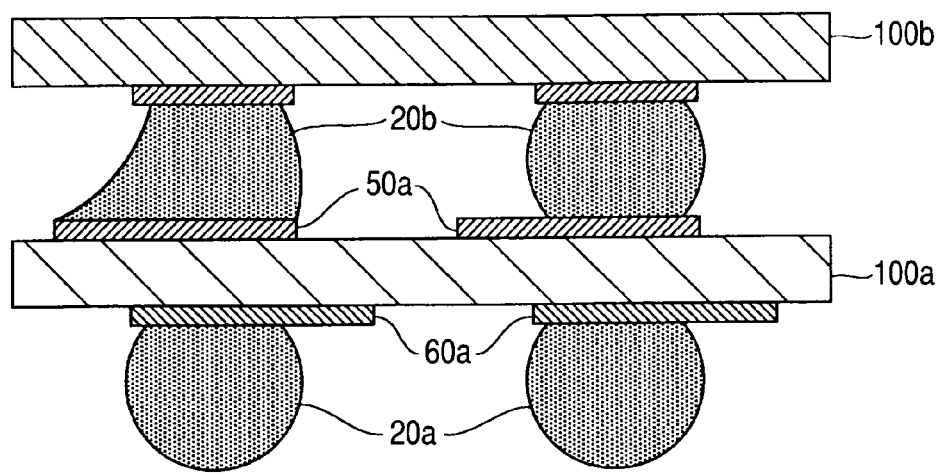
FIG. 6 is an enlarged cross-sectional view illustrating a portion of the electronic circuit device of FIG. 1.

FIG. 6 is an enlarged cross-sectional view illustrating an area including the ball electrodes 20b and the ball electrodes 20a that are positioned immediately below the ball electrodes 20b.

Figure 7A:
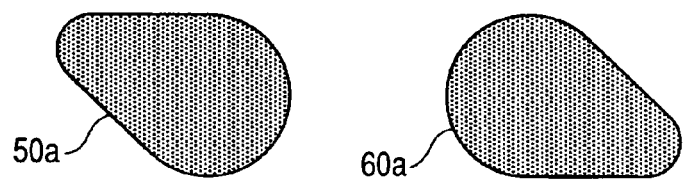
FIGS. 7A and 7B are views illustrating electrode pads of FIG. 6 and shaded images thereof.
Figure 7B:

FIG. 7A illustrates a planar shape in the printed wiring board 100a surface direction of the electrode pads 50a to which the ball electrodes 20b are connected in FIG. 6, and a planar shape in the printed wiring board 100a surface direction of the electrode pads 60a to which the ball electrodes 20a are connected in FIG. 6. Further, FIG. 7B illustrates shaded image through transmission (transmission shaded image) obtained by transmission of the ball electrodes 20b and the ball electrodes 20a shown in FIG. 4.

The ball electrode 20b at the left side of FIG. 6 is bonded to the electrode pad 50a in a state where the ball electrode 10b fully extends over the protruding portion of the electrode pad 50a. Further, the ball electrode 20a is bonded to the electrode pad 60a in a state where the ball electrode 20a does not extend over the protruding portion of the electrode pad 60a. A shaded image E5 is obtained by transmission of the ball electrodes 20b and 20a in this state. The ball electrode 20b at the right side of FIG. 6 is bonded to the electrode pad 50a in a state where the ball electrode 20b does not extend over the protruding portion of the electrode pad 50a. Further, the ball electrode 20a is bonded to the electrode pad 60a in a state where the ball electrode 20a does not extend over the protruding portion of the electrode pad 60a. A shaded image E6 is obtained by transmission of the ball electrodes 20b and 20a in this state.

As illustrated in FIG. 7A, the electrode pad 50a to which the ball electrode 20b is connected and the electrode pad 60a to which the ball electrode 20a is connected are each allowed to have a tear drop shaped cross section in which a protruding portion is added to a circle. For that reason, by determining a difference in shape of the shaded images E5 and E6 by use of an x-ray inspection apparatus, the bonding state of the ball electrode 20b to the electrode pad 50a and the bonding state of the ball electrode 20a to the electrode pad 60a can easily be detected.

Figure 8:
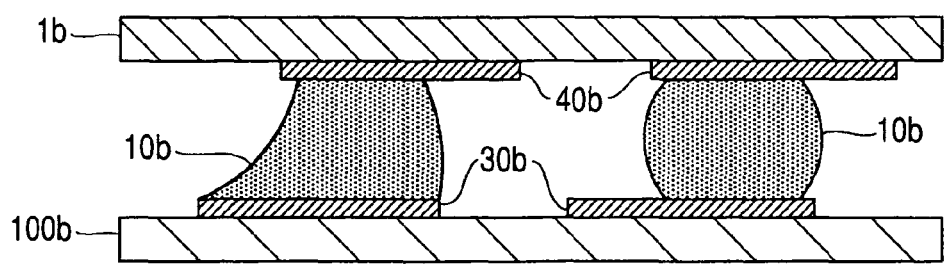
FIG. 8 is an enlarged cross-sectional view illustrating a portion of the electronic circuit device of FIG. 1.

FIG. 8 is an enlarged cross-sectional view illustrating an area including the ball electrodes 10b in the structure in which the semiconductor package 1b is mounted on the printed wiring board 100b.

Figure 9A:
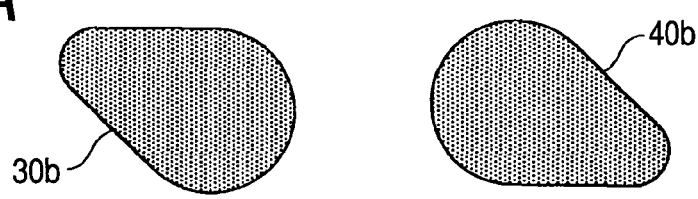
FIGS. 9A and 9B are views illustrating electrode pads of FIG. 8 and shaded images thereof.
Figure 9B:
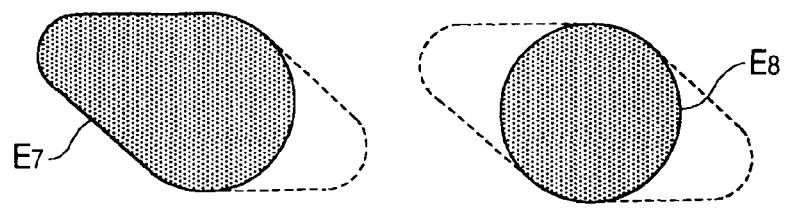

FIG. 9A illustrates a planar shape in the printed wiring board 100b surface direction of the electrode pads 40b to which upper portions of the ball electrodes 10b are connected in FIG. 8, and a planar shape in the printed wiring board 100b surface direction of the electrode pads 30b to which lower portions of the ball electrodes 10b are connected in FIG. 8. Further, FIG. 9B illustrates shaded image through transmission (transmission shaded image) obtained by transmission of the ball electrodes 10b.

The ball electrode 10b at the left side of FIG. 8 is bonded to the electrode pad 40b in a state where the ball electrode 10b does not extend over the protruding portion of the electrode pad 40b. Further, the ball electrode 10b is bonded to the electrode pad 30b in a state where the ball electrode 10b fully extends over the protruding portion of the electrode pad 30b. A shaded image E7 is obtained by transmission of the ball electrode 10b in this state. The ball electrode 10b at the right side of FIG. 8 is bonded to the electrode pad 40b in a state where the ball electrode 10b does not extend over the protruding portion of the electrode pad 40b. Further, the ball electrode 10b is bonded to the electrode pad 30b in a state where the ball electrode 10b does not extend over the protruding portion of the electrode pad 30*b*. A shaded image E8 is obtained by transmission of the ball electrode 10*b* in this state.

As illustrated in FIG. 9A, the electrode pad 30*b* and the electrode pad 40*b* to which the ball electrode 10*b* is connected are each allowed to have a tear drop shaped cross section in which a protruding portion is added to a circle. For that reason, by determining a difference in shape of the shaded images E7 and E8 by use of an x-ray inspection apparatus, the bonding state of the ball electrode 10*b* to the electrode pad 30*b* and 40*b* can easily be detected.

Figure 10:
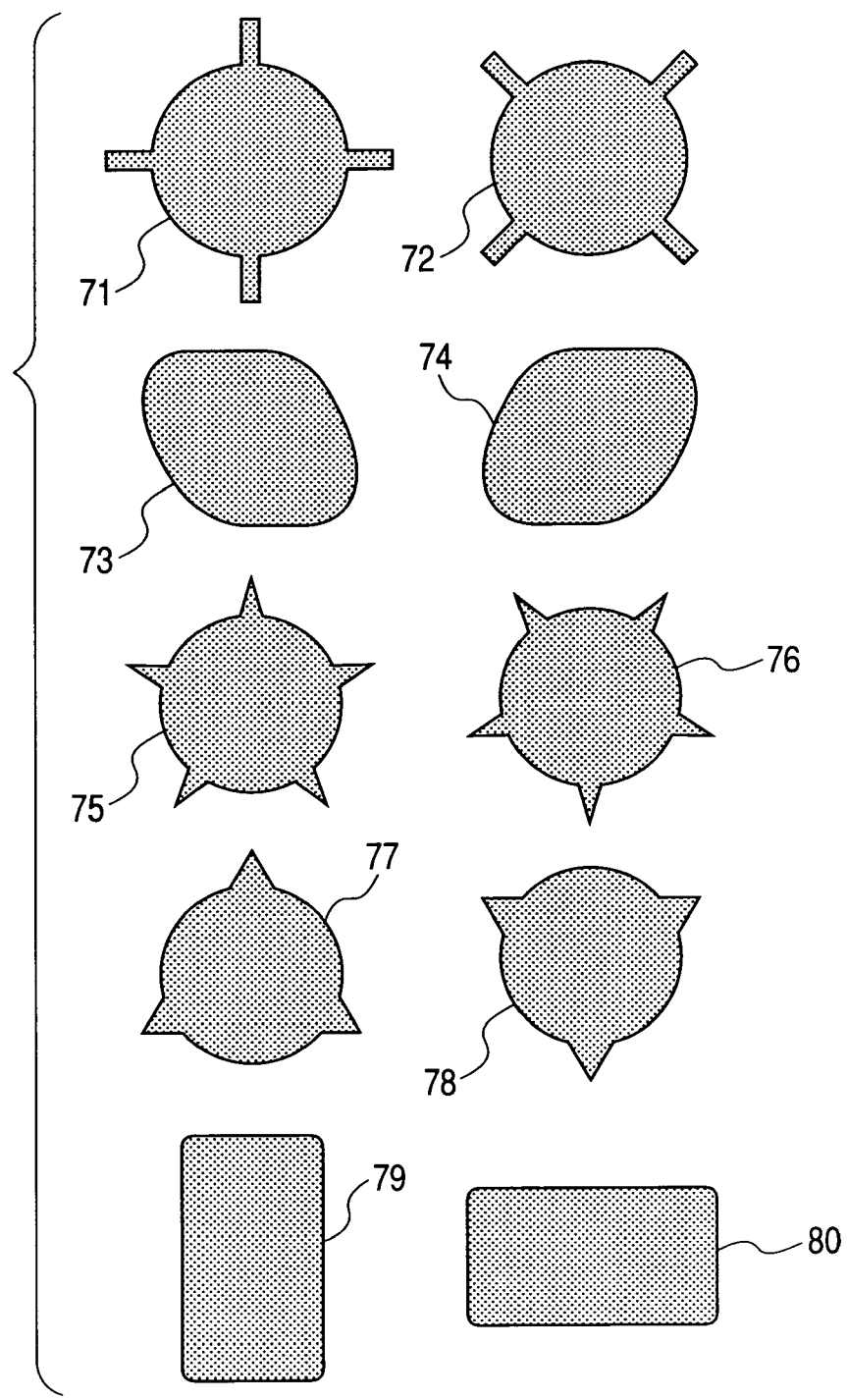
FIG. 10 is a view illustrating examples of modified shapes of an electrode pad.

The cross-sectional shape of the electrode pad is not limited to the tear drop shape. For example, as illustrated in FIG. 10, the electrode pad may have a cross-sectional shape 71 or 72 in which a cross-shaped protrusion is added to a circle, a parallelogram cross-sectional shape 73 or 74, a cross-sectional shape 75 or 76 in which a pentagonal protrusion is added to a circle, or a cross-sectional shape 77 or 78 in which a triangular protrusion is added to a circle. Further, an electrode pad having a rectangular cross-sectional shape such as one indicated by 79 or 80 can be used without any problem.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-134927, filed May 22, 2007, which is hereby incorporated by reference herein in its entirety.

The invention claimed is:

1. An electronic circuit device comprising:
   a stack structure in which a plurality of electronic circuit boards are stacked in three or more layers through ball electrodes bonded to electrode pads on the electronic circuit boards,
   wherein the electrode pads are disposed such that transmission shaded images of a pair of the electrode pads respectively provided in first and second layers partially overlap each other and have a non-overlapping region in which the transmission shaded images of the pair of the electrode pads are free from overlapping, and such that the transmission shaded images of the non-overlapping region are at least partially free from overlapping with transmission shaded images of all other ones of the electrode pads, and
   wherein an upper ball electrode and a lower ball electrode are respectively attached to the pair of the electrode pads in the first and second layers, with the upper and lower ball electrodes being arranged in an overlapping manner.

2. The electronic circuit device according to claim 1, wherein the pair of the electrode pads respectively provided in the first and second layers each has a protrusion arranged such that the protrusions are partly free from overlapping.

3. The electronic circuit device according to claim 1, wherein the transmission shaded images of the pair of the electrode pads each partially overlaps all other electrode pads provided at corresponding locations of other layers.

* * * * *